EXCLUSIVE-OR CIRCUIT EMPLOYING NEGATIVE RESISTANCE DIODES

Filed Nov. 30, 1964

INVENTOR.
MICHAEL COOPERMAN
BY John V. Regan
Attorney

United States Patent Office 3,278,762

Patented Oct. 11, 1966

3,278,762

EXCLUSIVE-OR CIRCUIT EMPLOYING NEGATIVE RESISTANCE DIODES

Michael Cooperman, Cherry Hill, N.J., assignor to Radio Corporation of America, a corporation of Delaware Filed Nov. 30, 1964, Ser. No. 414,661
9 Claims. (Cl. 307—88.5)

This invention relates to logic circuits and, in particular, to an "EXCLUSIVE OR" circuit that employs negative resistance diodes as the active elements.

Tunnel diodes are known to have an extremely fast switching speed, whereby a logic circuit employing tunnel diodes as the active elements is capable of very high speed operation. However, because a tunnel diode is a two-terminal device, there is essentially no isolation between the input and output thereof. This feature of the diode has occasioned difficulty in constructing some types of logic circuits that employ a plurality of tunnel diodes as the active elements.

It is one object of this invention to provide a novel logic circuit employing negative resistance diodes.

It is a more specific object of this invention to provide an improved logic circuit of the type generally referred to as an "EXCLUSIVE OR" circuit, which circuit employs only tunnel diodes as the active elements.

It is still another object of this invention to provide a logic circuit employing negative resistance diodes that can be driven by way of transmission lines without introducing large amplitude signals into the transmission line when a negative resistance diode is switched.

Briefly stated, the invention comprises a pair of oppositely poled tunnel diodes connected together by way of a current delay means, which may be an inductor, and each having approximately the same peak current $I_p$. First and second input means are coupled, respectively, to the other terminals of the diodes, the input means alone being insufficient to provide a diode current as great as $I_p$. The opposite ends of the current delay means are coupled by separate impedance elements to a current supply means which is selectively operable to supply pulses of forward diode current $I<2I_p$.

Figure 1:
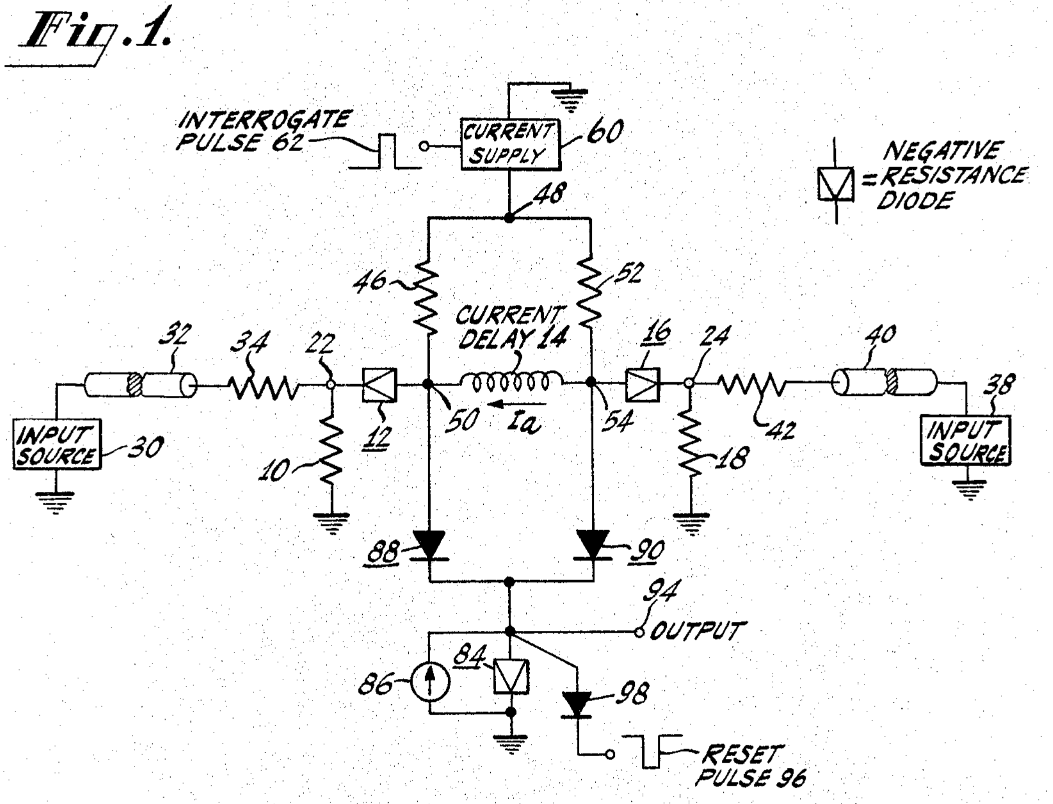
Figure 2:
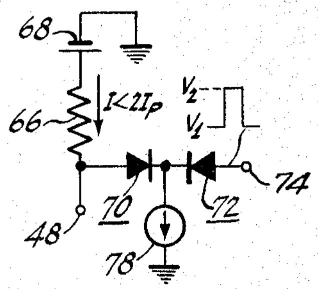
Figure 3:
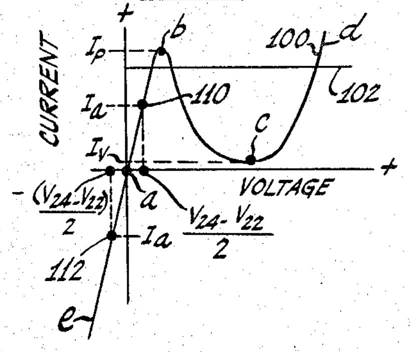

In the accompanying drawing, like reference characters denote like components; and FIGURE 1 is a schematic diagram of an "EXCLUSIVE OR" circuit embodying the invention;

FIGURE 2 is a schematic diagram of a selectively operable current pulse supply means for use in the FIGURE 1 circuit; and FIGURE 3 is a volt-ampere characteristic of a tunnel diode.

The circuit illustrated in FIGURE 1 includes a first resistor 10, a first negative resistance diode 12, a current delay means 14, a second negative resistance diode 16 and a second resistor 18 serially connected, in that order, in a closed loop. The loop is closed by way of circuit ground, to which the lower ends of the first and second resistors 10, 18 are returned. Negative resistance diodes 12 and 16, which preferably are tunnel diodes, have their anodes connected at opposite ends of the current delay means 14, illustrated as an inductor, whereby the diodes 12, 16 are oppositely poled with respect to one another in the loop.

The junction points 22 and 24 at the cathodes of the diodes 12 and 16, respectively, may be considered input terminals to the circuit. A first input source 30 is coupled by way of a transmission line 32 and a resistor 34 to the first input terminal 22. As will be described in greater detail hereinafter, resistors 34 and 10 are selected in value so as to provide a proper termination for the transmission line 32, and the ratio of these two resistors is chosen to provide the desired fraction of the source 30 output voltage at the first input terminal 22. A second input source 38 is similarly coupled by way of a transmission line 40 and a resistor 42 to the second input terminal 24. Resistors 18 and 42 have values selected according to the same criteria as the resistors 10 and 34.

A current supply resistor 46 is connected between a common junction 48 and a point 50 on the connection between first diode 12 and the inductor 14. Another resistor 52 is connected between the common junction 48 and a point 54 on the connection between second diode 16 and the inductor 14. A current supply means 60 is operable in response to an "interrogate" pulse 62 to supply pulses of current at the common junction 48, the current pulses having a polarity to cause current to flow in the forward direction through the negative resistance diodes 12 and 16.

By way of example, the selectively operable current supply 60 may take the form illustrated in FIGURE 2. In FIGURE 2, common junction 48 is connected by way of a resistor 66 to the positive terminal of a battery 68, the negative terminal of the battery being grounded. A pair of oppositely poled unidirectional conducting devices, illustrated as diodes 70, 72 are serially connected between the lower end of resistor 66 and a control input terminal 74 to which the interrogate pulses 62 are applied. Connected between circuit ground and the junction of diodes 70, 72 is a substantially constant current device 78. When the voltage at input terminal 74 has a value of $V_1$ volts (which may be negative relative to ground), diode 72 is reverse biased. A current flows, in the conventional direction, from the positive terminal of battery 68 and through resistor 66, diode 70, and constant current device 78 to ground. The device 78 is selected to have characteristics such that all of the current flowing through resistor 66 flows through the device 78, and the voltage at common junction 48 is such that essentially no current flows through the resistors 46 and 52 (FIGURE 1). On the other hand, when the voltage applied at terminal 74 has a value $+V_2$ volts, diode 72 becomes forward biased, and the voltage at the junction of diodes 70 and 72 rises to a sufficiently positive value to reverse bias diode 70. The current flowing through resistor 66 from battery 68 then flows to the common junction 48 and divides between the resistors 46 and 52 (FIGURE 1).

The output of the circuit preferably takes the form of a third negative resistance diode 84 which is bistably biased by a source 86 of substantially constant current. The anode of the third negative resistance diode 84 is connected by way of a pair of threshold devices 88 and 90, illustrated as diodes, to the junctions 50 and 54, respectively, at the anodes of the first and second negative resistance diodes 12 and 16, respectively. Diodes 88 and 90 may be, for example, so-called tunnel rectifiers. An output terminal 94 is connected at the anode of the third negative resistance diode 84, and "reset" pulses 96 for triggering the third diode 84 to a reference state are coupled by way of a diode 98 to the anode of the third diode 84.

As mentioned previously, the negative resistance diodes preferably are tunnel diodes because of the very fast switching speed and other desirable characteristics of such devices. The volt-ampere characteristic 100 of a typical tunnel diode is illustrated in FIGURE 3. As is known, a tunnel diode is a bidirectional conducting device having different conduction characteristics in the forward and reverse conducting directions. That portion of the characteristic 100 illustrated in the first quadrant of FIGURE 3 is the conduction characteristic for current flowing through the diode in the forward direction; the portion of the characteristic in the third quadrant is the conduction characteristic for reverse current flow.

The forward volt-ampere characteristic includes a first portion *ab* of positive resistance extending over a range of relatively low voltage values, a second region *cd* of positive resistance extending over a range of relatively high voltage values, and a region *bc* of negative resistance connecting the two positive resistance regions. The region *ae* of positive resistance in the reverse conducting direction has approximately the same slope as the region *ab* in the forward conducting direction. When the initial forward current through the diode is less than a value $I_p$, corresponding to the peak *b*, the voltage across the diode has a relatively low value, for example on the order of up to approximately 100 millivolts in the case of a germanium diode. Once the forward diode current exceeds the peak value $I_p$, the diode switches rapidly through its negative resistance region to the region *cd* of positive resistance. The voltage across the diode then may be of the order of approximately 500 millivolts. The diode remains in the high voltage state until its current decreases below a value $I_v$, corresponding to the value point *c* of the characteristic 100. When the current decreases below this value, the diode switches back through the negative resistance region to an operating point in the region *ab* of the characteristic 100.

Depending upon the loading on the diode, the diode may be either bistably biased or monostably biased. Third tunnel diode 84 is biased by the source 86 of substantially constant current, and this constant current may have a value close to the peak value $I_p$ of the diode, whereby the third diode 84 is bistably biased and has a load line such as the line 102 (FIGURE 3). The other diodes 12 and 16 have monostable load lines.

Consider now the operation of the circuit, and let it be assumed that each of the input sources 30 and 38 is a bistable tunnel diode circuit. For purposes of discussion, it will be assumed that the output voltage of a source 30 or 38 has a value of either 100 or 500 millivolts, depending upon the state of the tunnel diode in the input source. Three general operating conditions of the circuit are possible: (a) both input sources supplying 100 millivolts; (b) both input sources supplying 500 millivolts; and, (c) one input source supplying 100 millivolts and the other source supplying 500 millivolts.

Consider the first case, in which both input sources 30 and 38 are supplying output of 100 millivolts. Assuming transmission lines 32 and 40 having characteristic impedances of about 50 ohms, the resistors 34 and 42 may have values of 50 ohms, and the resistors 10 and 18 may have values of approximately 10 ohms each. Each line 32, 40 is terminated close to its characteristic impedance by a 50 ohm resistor in series with the parallel combination of a 10 ohm resistor and the impedance seen looking into one of the tunnel diodes. Because of voltage divider action, the voltages at each of the input terminals 22 and 24 has a value of approximately 17 millivolts. Third tunnel diode 84 is bistably biased in the low voltage state and the threshold devices 88 and 90 are reverse biased.

In the absence of an interrogate pulse 62, no current is supplied to the circuit from the current source 60. Accordingly, no current flows through either of the first and second tunnel diodes 12, 16, since there is no voltage differential between the input terminals 22 and 24. If a positive interrogate pulse 62 is now applied to the current source 60, a pulse of positive current is supplied at the common junction 48. This current divides equally between the resistors 46 and 52. Because of the inductor 14, one-half of the current from source 60 flows through first tunnel diode 12, and the other half flows through the second tunnel diode 16.

The current source 60 is selected to provide a pulse of current I which may be close to, but which is less than $2I_p$, where $I_p$ is the peak current of each tunnel diode 12 and 16. For example, let it be assumed for purposes of discussion that each of the diodes 12 and 16 has a peak current of seven milliamperes. Current source 60 may be selected to provide a pulse of positive current of ten milliamperes. This current divides equally between the resistors 46, 52, and five milliamperes flow through each of the tunnel diodes 12 and 16 from the source 60. The inductor 14 assures that these currents are restricted to flow into the respective diodes. Since five milliamperes is less than the peak value $I_p$ of either tunnel diode, the tunnel diodes remain in the low voltage state. The voltages at the junctions 50 and 54 are increased to perhaps 100 millivolts when the interrogate pulse 62 is applied to the current source 60. This voltage is determined by the voltage drop across the resistors 10 and 18 and the small voltage across the tunnel diodes 12 and 16. This voltage is insufficient to forward bias either of the threshold devices, diodes 88 and 90, whereby no additional current is applied to the third tunnel diode 84, and this diode remains in the low voltage state.

Consider now the second case where both of the input sources 30 and 38 supply outputs of approximately 500 millivolts. Because of voltage divider action, the voltages at input terminals 22 and 24 are about 80–85 millivolts. With no interrogate pulse 62 applied to the current source 60, no current flows through the diodes 12 and 16 because of the equal voltages at the input terminals 22 and 24. A reset pulse 96 is applied across third tunnel diode 84 prior to the application of an interrogate pulse 62 to the current pulse source 60. The reset pulse 96 serves the purpose of resetting the third tunnel diode, if necessary, to the low voltage state before the new state of the circuit is sampled. Upon the application of an interrogate pulse 62, current source 60 provides a pulse of positive current of ten milliamperes. As in the previous case, this current divides equally between the resistors 46 and 52, and five milliamperes of current flow in the forward direction through each of the tunnel diodes 12 and 16. This current is insufficient in magnitude to switch either of the tunnel diodes 12, 16 to a high voltage state. Accordingly, the voltages at junctions 50 and 54 increases only slightly when the interrogate pulse 62 is applied. The diodes 88 and 90 are chosen to have thresholds which are greater than the voltage differential between the anode of the third tunnel diode 84 and the junctions 50 and 54 for this operating condition, whereby no current is supplied to the third tunnel diode 84 and the third tunnel diode remains in the low voltage state. There is thus no change in the output at output terminal 94.

Consider now the third case, and let it be assumed that first input source 30 provides an output of 100 millivolts and that second input source 38 supplies an output of 500 millivolts. The voltages at input terminals 22 and 24 now have values of approximately 17 and 83 millivolts, respectively, whereby a current $I_a$ flows, in the conventional sense, from input terminal 24 through second tunnel diode 16, inductor 14, and first tunnel diode 12 to first input terminal 22. It will be noted that this current flows in the forward direction through first tunnel diode 12, and flows in the reverse direction through second tunnel diode 16. When the current through inductor 14 reaches a steady value, the voltage across each diode is approximately $$\frac{V_{24}-V_{22}}{2}=31.5 \text{ millivolts}$$

where $V_{24}$ and $V_{22}$ are the voltages at the input terminals 24 and 22, respectively. However, first diode 12 is forward biased and second diode 16 is reverse biased.

The value of the current $I_a$ flowing through the tunnel diodes 12, 16 is determined with reference to FIGURE 3. Assuming that the slopes of *ab* and *ae* are equal, the operating points 110 and 112 for the diodes 12 and 16, respectively, are the points on the characteristic 100 corresponding to voltages of $$\frac{V_{24}-V_{22}}{2} \text{ and } -\frac{(V_{24}-V_{22})}{2}$$

respectively. For diodes having peak currents of seven milliamperes, the current $I_a$ corresponding to these operating points is about three milliamperes. Thus, a forward current of three milliamperes flows through first tunnel diode 12, and a reverse current of three milliamperes flows through second tunnel diode 16.

Prior to the next interrogation pulse 62, a reset pulse 96 is applied across the third tunnel diode 84 to reset the tunnel diode to the low voltage, reference state (in this case, diode 84 already is in the low voltage state). When an interrogate pulse 62 is applied to the current source 60, a positive pulse of current of ten milliamperes flows into the common junction 48. The resistors 46 and 52 have relatively large values, whereby the ten milliampere pulse divides approximately equally between these resistors despite the small voltage differential between the input terminals 22 and 24. The inductor 14 assures that the five milliamperes of current flowing through each of the resistors 46 and 52 are steered to the tunnel diodes 12 and 16, respectively. To assure proper operation of the circuit, the $L/R$ time constant of the inductor 14 should be greater than the duration of the interrogate pulse 62, and preferably is at least three times greater.

The five milliamperes of forward current supplied by the source 60 to second tunnel diode 16 switches the diode current from three milliamperes of reverse current to two milliamperes of forward current. This current is insufficient to switch the second tunnel diode 16. However, the additional five milliamperes of forward current supplied to the first tunnel diode 12 increases the forward diode current to eight milliamperes, which is greater than the current peak $I_p$. Accordingly, first diode 12 switches to the high voltage region *cd* (FIGURE 3). It should be noted, however, that the voltage at first input terminal 22 rises by only about 50 millivolts even though the diode 12 switches. This voltage rise, which is due to the additional five milliamperes of current flowing through resistor 10, represents a relatively small voltage change at the output end of the transmission line 32, and does not have much of an effect on the tunnel diode (not shown) in the first input source 30. This is a distinct advantage of this circuit configuration.

Once the first tunnel diode 12 switches to the high voltage state, the voltage at junction 50 rises to about 550 millivolts, a value sufficient to exceed the conducting threshold of the coupling diode 88. A portion of the first tunnel diode 12 current then is diverted through coupling diode 88 to the third tunnel diode 84, increasing its forward current. Third tunnel diode 84 is quiescently biased close to its peak current value (see load line 102, FIGURE 3), and the increase in forward current switches the third tunnel diode to the high voltage, stable state. The voltage at output terminal 94 rises from about 100 to 500 millivolts when third tunnel diode 84 switches. This value is sufficiently positive to bias the coupling diode 88 below its conducting threshold, whereby the flow of current from junction 50 to the third tunnel diode 84 is interrupted. This has no effect on the output voltage, however, since third tunnel diode 84 is biased bistably and, once switched, the diode remains in the high voltage state until the next reset pulse 96 is applied. When the interrogate pulse 62 terminates, first tunnel diode 12 returns automatically to the low voltage state, since the first and second tunnel diodes are operated monostably.

It is believed apparent that the same general switching action takes place when the input source 30 provides an output of 500 millivolts and a second input source 38 provides an output of 100 millivolts. In this latter case, however, it is the second tunnel diode 16 which is switched to the high voltage state rather than the first tunnel diode 12. Insofar as the output from the circuit is concerned, however, it makes no difference to the third tunnel diode 84 which of the first and second tunnel diodes switches. In other words the third tunnel diode 84 switches to the high voltage state whenever one, but not both, of the input sources, 30, 38 provides the 500 millivolt output and the other source provides the 100 millivolt output. Thus, an output is provided from the circuit when the two inputs differ from each other. It will be recognized that this is the operation characteristic of an "EXCLUSIVE OR" circuit, or half-adder.

The circuit as a whole has several desirable operating features. First, it employs only tunnel diodes as the active elements, whereby the circuit is capable of very high speed operation. Second, the circuit lends itself readily to being driven from input sources by way of transmission lines because of the particular input characteristics of the circuit. In particular, the transmission lines may be terminated in their characteristic impedances while still providing desired operating voltages at the input terminals 22 and 24. Third, the voltage swing at the input terminals 22 or 24, when one of the tunnel diodes 12 or 16 switches, is held to a low value because of the low resistance of the resistors 10 and 18, whereby a large amplitude signal is not transmitted down the associated transmission line to the input source.

What is claimed is:

1. The combination comprising:

first and second input terminals;

a first negative resistance diode, current delay means, and a second negative resistance diode connected in series, in the order named, between the first and second input terminals, the diodes being oppositely poled with respect to one another;

each of said diodes having a forward volt-ampere characteristic defined by a first region of positive resistance at relatively low voltage, a second region of positive resistance at relatively high voltage, and an intermediate region of negative resistance, each diode having approximately the same peak current $I_p$ in the first positive resistance region;

a junction point;

first impedance means connected between said junction point and a first point on the connection between the first diode and the current delay means;

second impedance means connected between said junction point and a second point on the connection between the current delay means and the second diode;

separate input signal means coupled respectively to the the first and second input terminals; and current supply means coupled to said junction point and being selectively operable to supply a pulse of forward diode current $I<2I_p$.

2. The combination comprising:

first and second input terminals;

a first negative resistance diode, an inductor, and a second negative resistance diode connected in series, in the order named, between the first and second input terminals, the diodes being oppositely poled with respect to one another;

each of said diodes having a forward volt-ampere characteristic defined by a first region of positive resistance at relatively low voltage, a second region of positive resistance at relatively high voltage, and an intermediate region of negative resistance, each diode having approximately the same peak current $I_p$ in the first positive resistance region;

a junction point;

first impedance means connected between said junction point and a first point on the connection between the first diode and the inductor;

second impedance means connected between said junction point and a second point on the connection between the inductor and the second diode;

separate input signal means coupled respectively to the first and second input terminals; and current supply means coupled to said junction point and being selectively operable to supply a pulse of forward diode current $I<2I_p$.

3. The combination comprising:
first and second input terminals;
a first negative resistance diode, an inductor, and a second negative resistance diode connected in series, in the order named, between the first and second input terminals, the diodes being oppositely poled with respect to one another;
each of said diodes having a forward volt-ampere characteristic defined by a first region of positive resistance at relatively low voltage, a second region of positive resistance at relatively high voltage, and an intermediate region of negative resistance, each diode having approximately the same peak current $I_p$ in the first positive resistance region;
a junction point;
first impedance means connected between said junction point and a first point on the connection between the first diode and the inductor;
second impedance means connected between said junction point and a second point on the connection between the inductor and the second diode;
separate input signals means coupled respectively to the first and second input terminals;
current supply means coupled to said junction point and being selectively operable to supply a pulse of forward diode current $I<2I_p$, and
said inductor having an $L/R$ time constant at least three times the duration of a said pulse of current.

4. The combination comprising:
first and second input terminals;
a first tunnel diode, current delay means, and a second tunnel diode connected in series, in the order named, between the first and second input terminals, the diodes being oppositely poled with respect to one another;
each of said diodes having a forward volt-ampere characteristic defined by a first region of positive resistance at relatively low voltage, a second region of positive resistance at relatively high voltage, and an intermediate region of negative resistance, each diode having approximately the same peak current $I_p$ in the first positive resistance region;
a junction point;
first impedance means connected between said junction point and a first point on the connection between the first diode and the current delay means;
second impedance means connected between said junction point and a second point on the connection between the current delay means and the second diode;
separate input signal means coupled respectively to the first and second input terminals; and
current supply means coupled to said junction point and being selectively operable to supply a pulse of forward diode current $I<2I_p$.

5. The combination comprising:
first and second input terminals;
a first negative resistance diode, current delay means, and a second negative resistance diode connected in series, in the order named, between the first and second input terminals, the diodes being oppositely poled with respect to one another;
each of said diodes having a forward volt-ampere characteristic defined by a first region of positive resistance at relatively low voltage, a second region of positive resistance at relatively high voltage, and an intermediate region of negative resistance, each diode having approximately the same peak current $I_p$ in the first positive resistance region;
a junction point;
first impedance means connected between said junction point and a first point on the connection between the first diode and the current delay means;
second impedance means connected between said junction point and a second point on the connection between the current delay means and the second diode;
current supply means coupled to said junction point and being selectively operable to supply a pulse of forward diode current $I<2I_p$; and
separate input signal means coupled respectively to the first and second input terminals, and being operative to cause a maximum current less than $I_p$ to flow through a said diode in the absence of a said pulse of current.

6. The combination comprising:
first and second input terminals;
a first negative resistance diode, current delay means, and a second negative resistance diode connected in series, in the order named, between the first and second input terminals, the diodes being oppositely poled with respect to one another;
each of said diodes having a forward volt-ampere characteristic defined by a first region of positive resistance at relatively low voltage, a second region of positive resistance at relatively high voltage, and an intermediate region of negative resistance, each diode having approximately the same peak current $I_p$ in the first positive resistance region;
a junction point;
first impedance means connected between said junction point and a first point on the connection between the first diode and the current delay means;
second impedance means connected between said junction point and a second point on the connection between the current delay means and the second diode;
separate input signal means coupled respectively to the first and second input terminals;
current supply means coupled to said junction point and being selectively operable to supply a pulse of forward diode current $I<2I_p$;
a third negative resistance diode;
first and second threshold means coupling said first point and said second point, respectively, to a single terminal of said third diode; and
means connected across said third diode for biasing said third diode bistably, said third diode being poled to conduct current supplied through a said threshold means in the forward direction of the third diode.

7. The combination as claimed in claim 6, wherein the first, second and third diodes are tunnel diodes, and including pulse input means coupled to the third tunnel diode for selectively switching said third diode to a reference state.

8. The combination comprising:
a first resistor, a first tunnel diode, an inductor, a second tunnel diode and a second resistor serially connected in a closed loop, the anodes of the first and second diodes being connected to opposite ends of the inductor;
a junction point;
third and fourth resistors each being connected between a different end of said inductor and said junction point;
first and second input means connected at the cathodes of the first and second tunnel diodes, respectively; and
means for selectively applying a pulse of forward diode current at said junction.

9. The combination comprising:
a first resistor, a first tunnel diode, an inductor, a second tunnel diode and a second resistor serially connected in a closed loop, with first, like electrodes of the first and second tunnel diodes being connected to opposite ends of said inductor;
the first and second diodes having approximately the same peak current $I_p$;
first and second input means connected at the other electrodes of the first and second diodes, respectively;
third and fourth resistors each being connected between a common junction and a different end of said inductor; and means for selectively applying a pulse of forward diode current $I<2I_p$ at said common junction.

References Cited by the Examiner

UNITED STATES PATENTS 2,992,339 6/1961 Meyers ------------ 307—88.5

OTHER REFERENCES

IBM Technical Disclosure Bulletin, vol. 4, No. 1, June 1961, page 42, "Esaki Diode Exclusive or Circuit" by A. J. Gruodis et al.

ARTHUR GAUSS, *Primary Examiner.*

J. ZAZWORSKY, *Assistant Examiner.*